United States Patent [19]

Kiuchi et al.

[11] Patent Number: 4,910,466

[45] Date of Patent: Mar. 20, 1990

[54] SELECTING MEANS FOR SELECTING A PLURALITY OF INFORMATION

[75] Inventors: Atsushi Kiuchi, Kunitachi; Jun Ishida, Koganei; Kenji Kaneko, Sagamihara; Tetsuya Nakagawa, Kokubunji; Tomoru Sato; Shigeki Masumura, both of Kodaira; Noriyasu Suzuki, Fuchu; Yoshimune Hagiwara, Hachioji, all of Japan

[73] Assignees: Hitachi Microcomputer Engineering Ltd.; Hitachi, Ltd.; Hitachi VLSI Engineering Corporation, all of Tokyo, Japan

[21] Appl. No.: 304,878

[22] Filed: Jan. 31, 1989

Related U.S. Application Data

[63] Continuation of Ser. No. 944,002, Dec. 22, 1986, abandoned.

[30] Foreign Application Priority Data

Dec. 20, 1985 [JP] Japan ................................ 60-288195

[51] Int. Cl.[4] .......................................... H03K 17/693
[52] U.S. Cl. ..................................... 328/137; 328/104; 328/119; 328/154; 307/463; 307/443; 307/243; 307/279
[58] Field of Search ............... 328/104, 137, 152, 154, 328/119; 307/443, 243, 571, 572, 463, 279

[56] References Cited

U.S. PATENT DOCUMENTS

| 3,922,641 | 11/1975 | Gates, Jr. ............................ | 328/154 |
| 4,024,512 | 5/1977 | Amelio et al. ...................... | 307/463 |
| 4,280,212 | 7/1981 | Ransom et al. ..................... | 307/270 |
| 4,369,408 | 1/1983 | Plohn et al. ........................ | 328/154 |
| 4,544,854 | 10/1985 | Ulmer et al. ....................... | 307/243 |
| 4,645,944 | 2/1987 | Uya .................................... | 307/243 |

Primary Examiner—Stanley D. Miller
Assistant Examiner—Timothy P. Callahan
Attorney, Agent, or Firm—Antonelli, Terry & Wands

[57] ABSTRACT

A plurality of external input information are added to a selecting circuit. The output of the selecting circuit is fed back as one of the external input information to the selecting circuit. The input signal groups are decoded, and are produced as control signals to specify the external input information in synchronism with clock signals. When the input select signal groups have the non-selection mode, the output that is fed back is necessarily selected.

12 Claims, 8 Drawing Sheets

| IN | CLK | OUT |
|----|-----|-----|
| 0  | 0   | Z   |
| 0  | 1   | 1   |
| 1  | 0   | Z   |
| 1  | 1   | 0   |

FIG. 9

SELECTING MEANS FOR SELECTING A PLURALITY OF INFORMATION

This application is a continuation of application Ser. No. 944,002, filed Dec. 22, 1986.

BACKGROUND OF THE INVENTION

A selecting circuit (or a multiplexer) which selects data introduced through many input lines in response to a control signal and which sends the selected data to an output line has heretofore been provided in a variety of places in a data processor.

Figure 10:
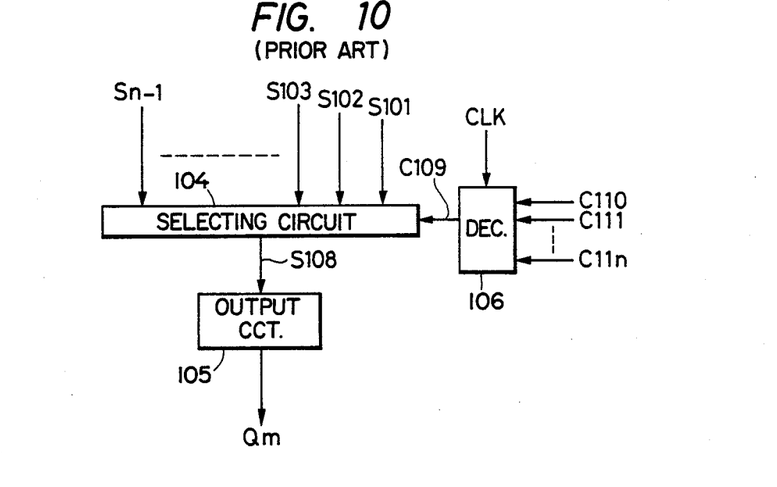
FIG. 10 is a diagram showing the structure of a conventional selecting device.

FIG. 10 is a diagram illustrating a selecting apparatus of this type, wherein reference numeral 104 denotes a selecting circuit to which input information S101 to Sn-1 are supplied, and 105 denotes an output circuit which receives, as an input, the output S108 of the selecting circuit. The output circuit 105 includes a data-holding circuit and produces an output signal Qm. Reference numeral 106 denotes a logic circuit which decodes input select signal groups C110, C111, ..., C11n, and produces a control signal C109 of the selecting circuit 104 in synchronism with a clock signal CLK. Therefore, any one of the input information S101 to $S_{n-1}$ is selected and is produced as the output Qm.

When the input select signal groups C110 to C11n are changed, new input information is selected in synchronism with the clock signal CLK. In this case, if the input select signal groups C110, C111, ..., C11n are input at the same time as the clock signals CLK, a fault caused by circuit delay and the like is formed in the control signal C109, so that the selecting circuit 104 may malfunction temporarily at the starting point of synchronizing. That is, input information that is not the one which should be finally selected appears on the selected output S108 and on the output signal Qm for a short period of time.

Generally, however, the erroneous output is replaced by a proper output at a moment when the control signal C109 is stabilized, and there remains no problem. However, there remains a problem when the input select signal groups C110 to C11n have a non-selection mode. That is, when the input signal groups C110 to C11n have the non-selection mode, the control signal C109 does not serve as a signal that identifies a particular input information. Therefore, the output signal Qm holds the signal that has appeared at the starting point of synchronizing. Since input information, which is selected at the starting point of synchronizing, varies depending upon circuit delay and the like, it is not fixed at all times. When the non-election mode is given to the input select signal groups C110 to C11n, it is desired that the output signal Qm is the input information that has been elected before the non-selection mode is given. Therefore, the fact that it is not certain which input information will be produced, means that there exists the probability of a malfunction.

In order to solve this problem, for example, the input signal groups C110, C111, ..., C11n should be input to the logic circuit 106 before being synchronized by the clocks CLK, and should be synchronized by the clocks CLK after the transition of the logic circuit 106 has been finished to prevent the development of a fault. Thus, the selecting circuit is prevented from malfunctioning, and is allowed to operate properly even during the non-selection mode. For this purpose, the circuit must be operated at high speeds to generate these input select signal groups C110 to C11n, resulting in an increased burden for designing the circuits of these portions. Alternatively, the clocks ignal CLK could be delayed with respect to the input signal groups C110, C111, ..., C11n to avoid the problem. In this case, however, the output must be produced after the delayed period of time has passed, causing the operation speed of the whole system inclusive of the selecting device to decrease. During the delayed period, in particular, variance in the characteristics of parts consituting the device must be taken into consideration. That is, the time must have a margin correspondingly, causing the operation speed to decrease.

SUMMARY OF THE INVENTION

The object of the present invention is to improve such problems inherent in the conventional art, and to provide a selecting circuit which is capable of producing correct select signals under any circumstances, and which operates at high speed without the need of setting a time for determining decode signals for control.

The present invention was accomplished by giving attention to the existing problem in that the control signal C109 doeso not form a signal that specifies the input inforrmation to be selected when the input select signal groups C110 to C11n take the non-selection mode. According to the present invention, one of the output signals is fed back as input information. When the input signals C110 to C11n take the non-selection mode, the control signal C109 necessarily specifies the output information that is fed back as the input information to be selected.

DETAILED DESCRIPTION OF THE PREFERRED EMBODIMENTS

Figure 1:
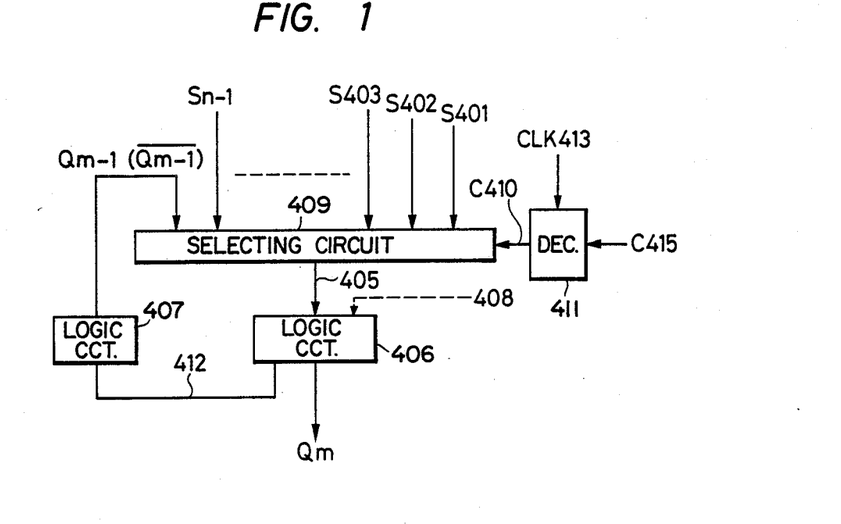
FIG. 1 is a diagram illustrating the structure of a selecting circuit according to an embodiment of the present invention.

FIG. 1 is a diagram which schematically illustrates the structure of a selecting circuit according to an embodiment of the present invention, wherein reference numeral 409 denotes a selecting circuit which receives input select signal groups S401, S402, S403, ..., Sn-1 of a number n-1 sent from an external unit, receives an output signal Qm-1 (or $\overline{Qm-1}$), necessarily selects any one of the above n inputs after every period in response to a c ontrol signal group C410, and supplies an output signal 405. Here, the output signal $\overline{Qm-1}$ is an inverted signal of the ouput signal Qm-1. Reference numeral 411 denotes a logic circuit which decodes the input select signal group C415 input from an external unit, and produces the control signal groups C410 synchronism with clock signals CLK 413. Reference numeral 406 denotes a logic circuit which produces an output Qm from the selecting circuit 409 and an input signal 412 that will be sent to a logic circuit 407 for feedback. Reference numeral 408 denotes a signal that is necessary for statically holding the output of the logic circuit 406. The signal 408, however, often may not be required. Further, the input signal 412 to the logic circuit 407 may often be the same as the output signal Qm, and the output 405 of the selecting circuit 409 also may be the same.

When the signals 412, 405 and Qm are all the same, the logic circuit 406 may have only the function of passing the signal 405 from the input to the output thereof. A logic circuit 407 delays the output signal 412 of the logic circuit 406, and produces an input signal Qm-1 (or $\overline{Qm-1}$) that will be fed back to the selecting circuit 409. In addition to feeding the condition of the previous period of the logic circuit 406 back to the selecting circuit 409, the logic circuit 407 has the function of preventing the racing of signals through a path 409→406→407→409 when the output signal Qm-1 (or output signal $\overline{Qm-1}$) is selected by the selecting circuit 409.

According to this embodiment as described above, the output of the selecting circuit 409 is used as an input signal of the selecting circuit 409 together with the external signals. The output of the selecting circuit 409 during the non-selection mode is the feedback signal of the output which is selected in the previous period. Therefore, the non-selection condition is substantially eliminated. Namely, among N input signals to be selected, N-1 input signals are introduced from an external unit, and a remaining input signal is provided from the selecting circuit 409 by feeding back the output of the logic circuit 406 that is located next to the selecting circuit 409. The N input signals are controlled by a control signal C410 for selection. When one of the n-1 input signals sent from the external unit are selected, the control signal C410 necessarily selects the feedback signal of the previous period. With the feedback signal being selected, the non-selection condition can be eliminated, whereby the selecting circuit 409 produces an output after every period. Therefore, even when an incorrect signal is temporarily selected at the starting point of synchronizing, the previous incorrect select signal is readily cancelled by the correct select signal.

Figure 2:
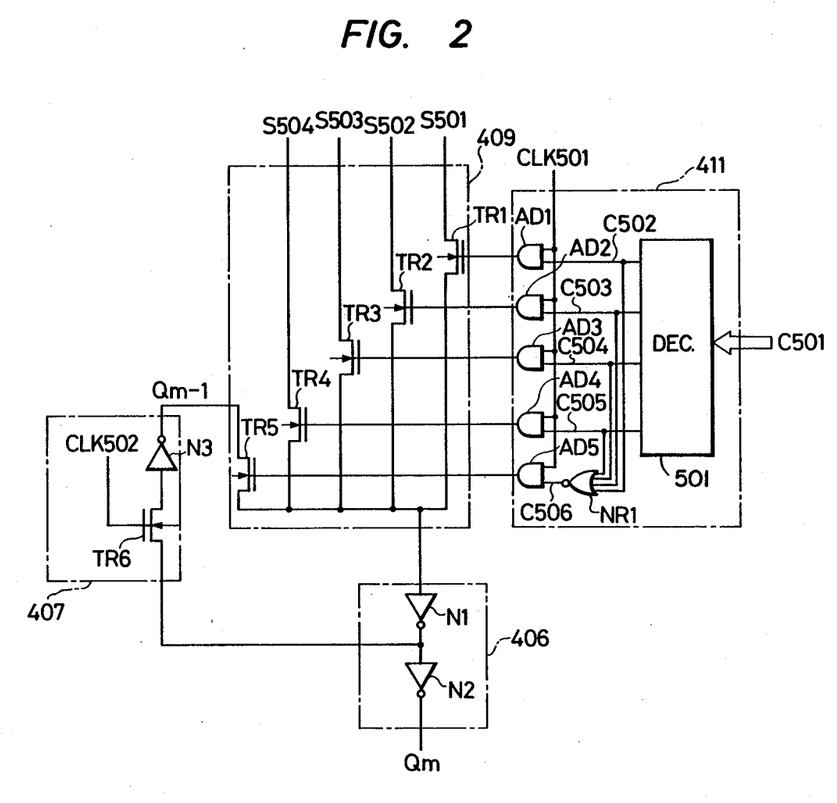
FIG. 2 is a diagram of the selecting circuit of an embodiment when the circuit of FIG. 1 is constituted by a dynamic circuit.

FIG. 2 is a diagram of a logic circuit connection in which the circuit of FIG. 1 is constituted by a dynamic circuit. In FIG. 2, AND circuits AD1 to AD5, NOR circuit NR1, and decoder 501 correspond to the logic circuit 411 of FIG. 1, transfer gates TR1 to TR5 correspond to the selecting circuit 409 of FIG. 1, NOT circuits N1 and N2 correspond to a logic circuit 406 FIG. 1, and transfer gate TR6 and NOT circuit N3 correspond to the logic circuit 407 of FIG. 1. When the outputs C502 to C505 of the decode circuit 501 are all "0", the output C506 assumes the level "1", and the input fed back in the previous period is necessarily selected.

Figure 3:
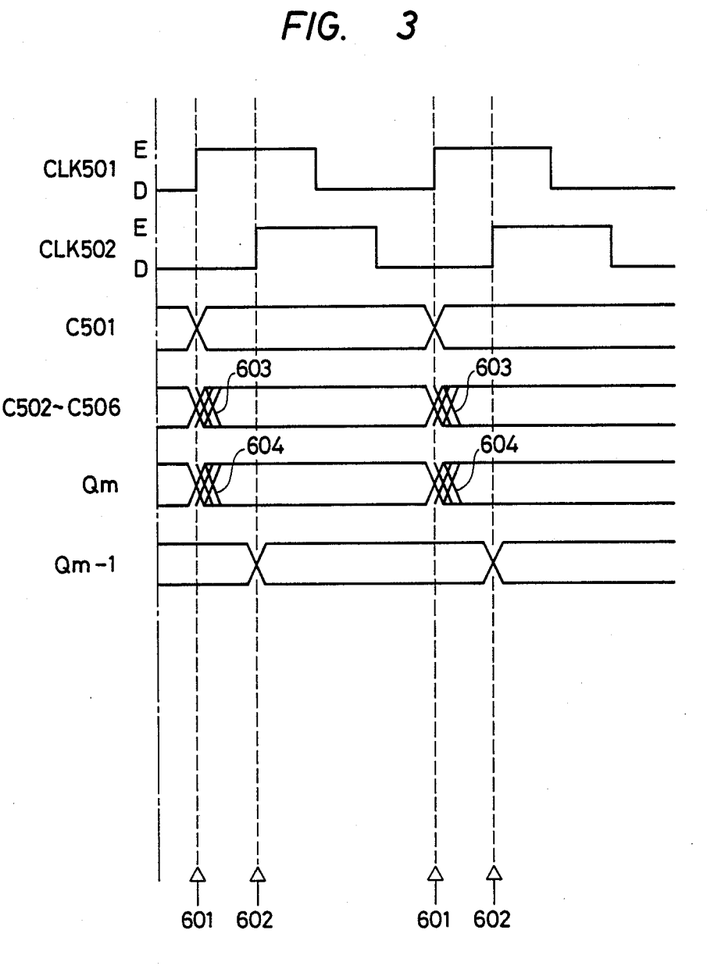
FIG. 3 is an operation time chart of the circuit of FIG. 2.

FIG. 3 is an operation timing chart of the circuit of FIG. 2. In FIG. 3, a clock CLK 501 is changed to the enable condition E at a time 601. In the conventional example of FIG. 10, the clock CLK 501 is input prior to the time 601, and the input select signal groups C502 to C506 must be established prior to the time 601. According to this embodiment as shown in FIG. 3, however, the clock CLK 501 may be input at the time 601. Therefore, an unstable condition may appear on the input signals C502 to C505 and on the output signal Qm at the starting point of synchronizing as designated at 603 and 604. According to this embodiment, however, any one of the input signals C502 to C506 is selected after every period, and correct data is necessarily produced when the stable output condition is established.

After the output signal Qm is stabilized, the clock CLK 502 assumes the enable condition at a time 602 and is fed back to the selecting circuit as an input of the next period. At the moment 602 at which the clock CLK 502 is enabled, the output signal Qm has been stabilized, and the racing will not develop if the clock CLK 502 has been disenabled at a time when the clock CLK 501 is enabled in the next period.

Even when the condition of the previous period is maintained without change with the above circuit structure, the output Qm-1 (or $\overline{Qm-1}$) will be selected by the selecting circuit and the same signal as that of the previous period is produced again. At this time, therefore, the control signal group of the selecting circuit has not yet been determined, and the initial condition can be restored even if another signal is erroneously selected for a brief period of time. Unlike the conventional circuit, therefore, the control signal doesn't have to be decoded before synchronization, and the time for determining the control signal doesn't have to be set. Namely, the input signal C501 and the clock CLK501 mayb e synchronized at the same timing to realize a circuit that operates at high speed. In designing the circuit, furthermore, there is no need to giving attention to the time difference between the input select signal and the clock signal.

Figure 4:
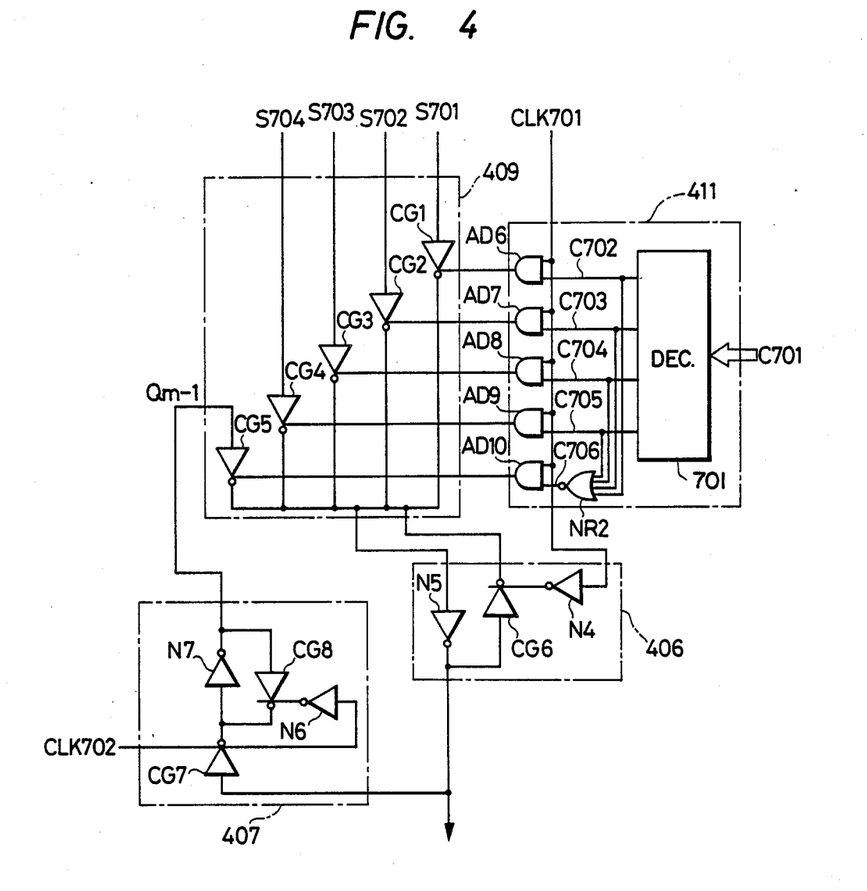
FIG. 4, 5 and 6 are diagrams of selecting circuits according to embodiments when the circuit is constituted by static circuits.

FIG. 4 is a diagram of an embodiment when the circuit of FIG. 1 is constituted by a static circuit. This circuit makes use of clocked inverters CG1 to CG8 having a tristate output instead of the transfer gates TR1 to TR6 of FIG. 2.

Figure 7:
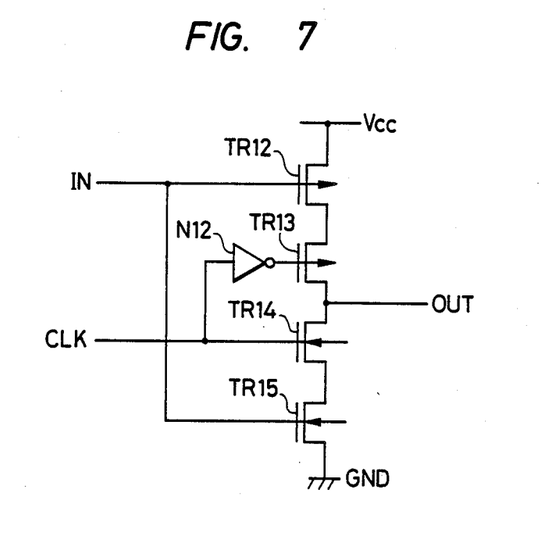
FIG. 7 is a circuit diagram showing logic symbols of inverters CG1 to CG17 having tristate outputs of FIGS. 4 and 6.
Figure 8:
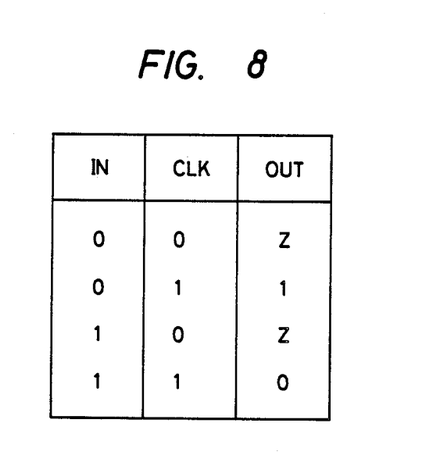
FIG. 8 is a diagram showing a truth table for the circuit of FIG. 7.

FIG. 7 is a diagram showing a circuit represented by the logic symbols of the clocked inverters CG1 to CG8 having a tristate output as shown in FIG. 4, and FIG. 8 is a truth table of the circuit of FIG. 7. In FIG. 8, symbol "Z" means that the output is assuming the high-impedance condition. As shown in FIG. 7, the inverter has the structure in which CMOS transistors TR12 and TR15 coupled to the input signal IN are connected to the outside of CMOS transistors TR13 and TR14 that receive the clock CLK. When the clock CLK is "1", the transistors TR13 and TR14 are rendered conductive. When the input IN is "1", the transistor TR15 is rendered conductive and the output OUT assumes the GND level. When the input IN is "0", the transistor TR12 is rendered conductive and the output OUT assumes the Vcc level.

Figure 5:
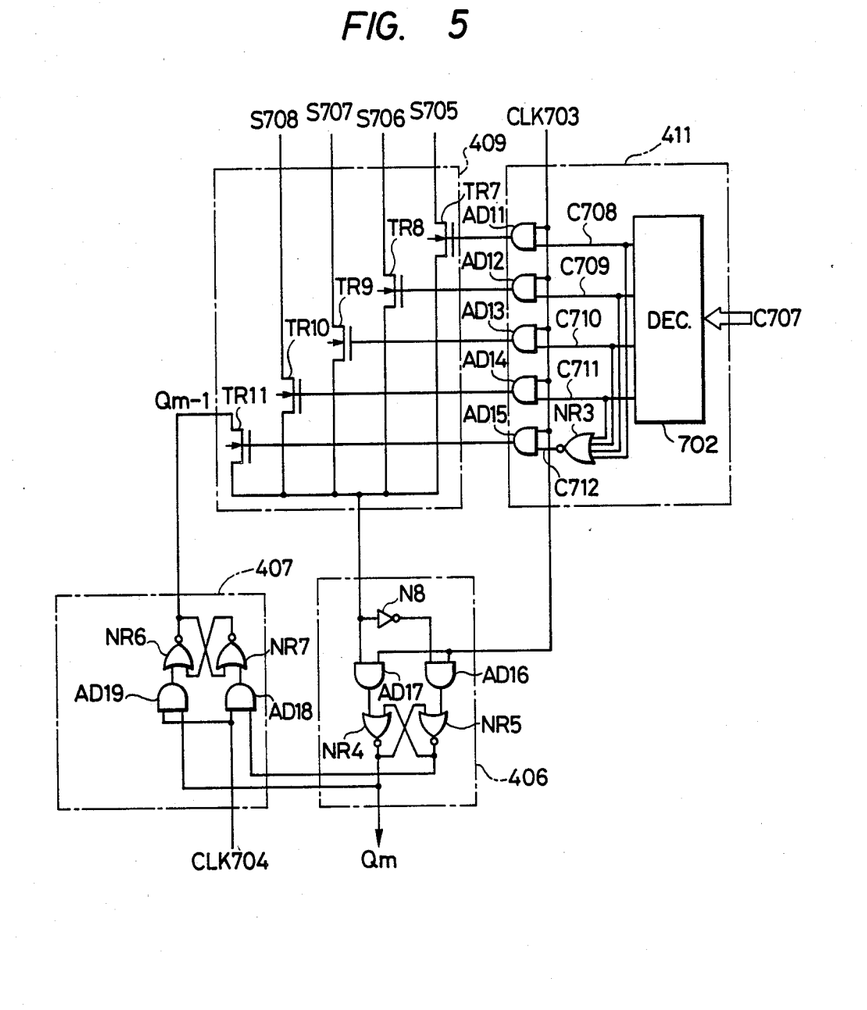

FIG. 5 is a diagram showing the structure of the selecting circuit according to a further embodiment of the present invention, wherein the functions are the same as those of the circuit of FIG. 4 but the constitutional elements are changed. Namely, transfer gates TR7 to TR11 and a flip-flop consisting of a combination of AND gates AD16 to AD19 and NOR gates NR4 to NR7, are used instead of the clocked inverters CG1 to CG8 having the tristate output.

Figure 6:
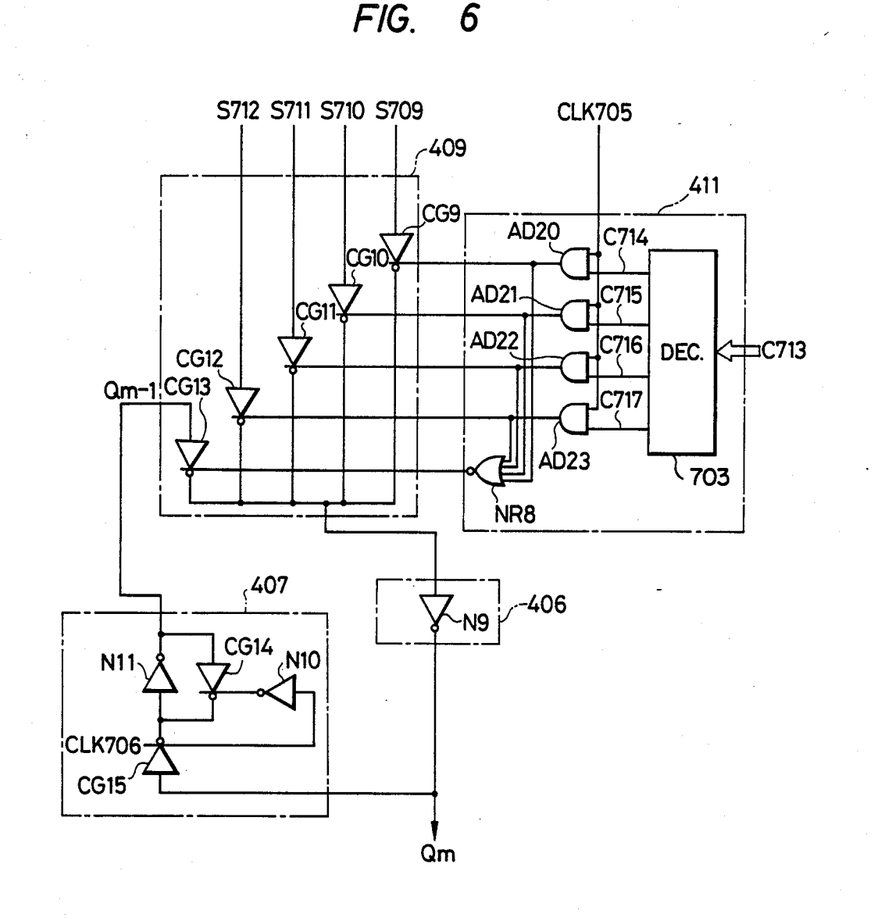

FIG. 6 is a diagram showing the structure of the selecting circuit according to a still further embodiment of the present invention, wherein a clocked inverter CG13 having a tristate output further exhibits the function of the clocked inverter CG6 having a tristate output of FIG. 4, in order to decrease the number of elements.

Figure 9:
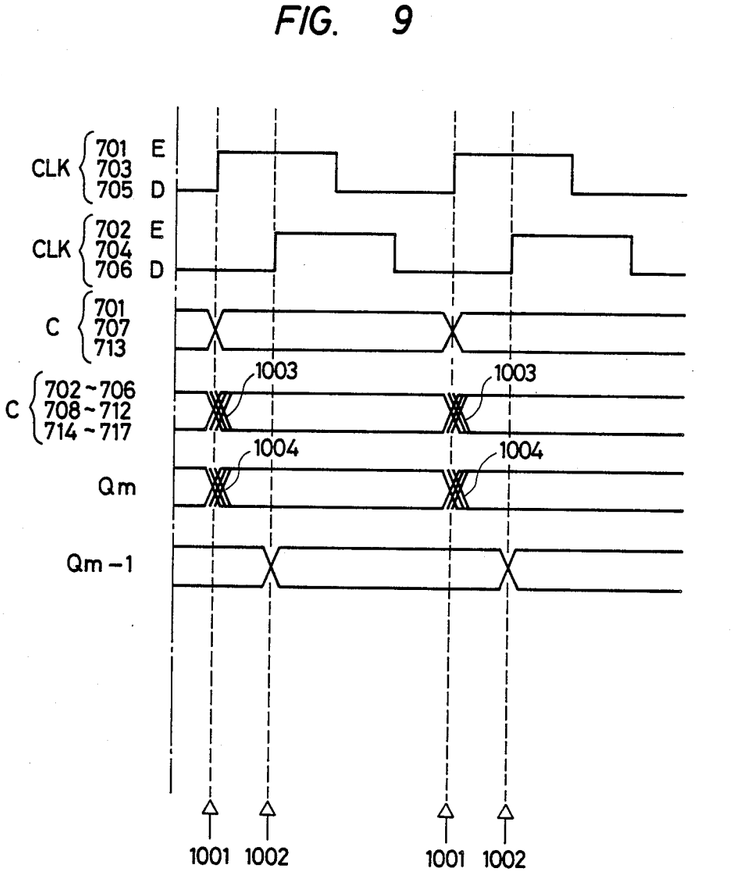
FIG. 9 is an operation timing chart of the circuits of FIGS. 4, 5 and 6.

FIG. 9 is an operation timing chart of the circuits of FIGS. 4, 5 and 6. In FIG. 4, the clocked inverter CG6 having a tristate output feeds back the output Qm during a period in which the clock CLK is inverted to statically hold QM has passed through the elements CG15 and N11, and has arrived at the input Qm-1 of the element CG13 at a time 1002 before the clock CLK701 is inverted as shown in FIG. 9, the element CG13 is rendered conductive during the period in which the clock CLK701 is inverted so that the output Qm is statically held. Even in the circuit of FIG. 5 the same modifications can be effected as those described with reference to FIGS. 4 and 6.

The circuits of FIGS. 4, 5 and 6 can be used for the cases where the period is long and the output loses stability when a dynamic circuit is employed, and can also be used in a circuit that operates to temporarily stop the clock signals during the operation. For example, the selecting circuit of this embodiment can be effectively utilized when the processor that selects a signal for every fundamental clock, holds the same signal at the next clock.

In the aforementioned embodiments, the delay circuit 407 of FIG. 1 operates to delay the output signal Qm by the second clock signal and to feed it back. However, any circuit structure may be employed without using the second clock signal provided the output signal Qm can be fed back after it is stabilized. For instance, there can be used a delay circuit which consists of inerteres connected in cascade or which consists of a combination of a resistor and a capacitor. Further, even when the delay circuit is to be consituted using the second clock signal, it is allowable to use, as the second clock signal, an inverted signal of the first clock signal that is used for synchronizing the selecting circuit.

According to the present invention as described above, the feedback signal of the condition of the previous period is added to the selected input signal to eliminate the nonselection mode. Therefore, a correct select signal is necessarily produced at all times without the need of setting a time for determining a decode signal for control. Therefore, the input timing of the control signal decoding circuit canbe brought to be the same asa the synchronizing timing of the output, making it possible to peform the operation at high speed.

We claim:

1. A switching circuit comprising:
    first means including a plurality of input lines and a feedback line for receiving a plurality of input information at respective input lines and for receiving a feedback signal at said feedback line;
    second means responsive to select signals identifying one of said plurality of input information or said feedback signal for generating decoded output signals related to said select signals;
    third means coupled to said first means and said second means for transferring said one of said plurality of input information or said feedback signal from said first means as a data signal to an output line in response to said decoded output signals of said second means; and
    fourth means for feeding back said data signal of said output line of said third means as said feedback signal to said feedback line of said first means.

2. A switching circuit according to claim 1, wherein said third means transfers said one of said plurality of input information or said feedback signal in accordance with a first clock signal; and
    said fourth means includes means for holding said data signal in accordance with a second clock signal different from said first clock signal.

3. A switching circuit comprising:
    first means for receiving a plurality of input information signals;
    second means responsive to select signals identifying one of said plurality of input information signals for generating a first selection output signal for selecting said one input information signal, and responsive to said select signals not identifying one of said plurality of informations signals for generating a second selection output signal;
    third means for receiving one of said plurality of input information signals and for producing an output signal related to said one input information signal;
    fourth means connected to said second means and coupled between said first means and said third means for receiving as inputs said plurality of input information signals from said first means and for transferring one of said plurality of input information signals from said first means to said third meansn in response to said first selection output signal of said second means; and
    fifth means for holding a data signal related to said output signal produced by said third means and for feeding back said data signal as an input to said fourth means;
    said fourth means further including means responsive to said second selection output signal for transferring said feedback data signal to said third means.

4. A switching circuit according to claim 3, whereinn said fourth means transfers said one of said plurality of input information signals in accordance with a first clock signal; and
    said fifth means includes means for holding said data signal in accordance with a second clock signal different from said first clock signal.

5. A switching circuit comprising:
    first means including a plurality of input lines and a feedback line for receiving a plurality of input information at respective input lines and for receiving a feedback signal at said feedback line;
    second means for receiving select signals identifying one of said plurality of input information and for generating decoded output signals related to said select signals, said select signals further identifying said feedback signal when none of said plurality of input information is identified;
    third means coupled to said first means and said second means for transferring said one of said plurality of input information from said first means as data to an output line in response to said decoded output signals of said second means; and
    fourth means for feeding back data of said output line of said third means as said feedback signal to said feedback line of said first means in accordance with a first clock signal, said third means including means responsive to said decoded output signals indicating that none of said plurality of input information are to be transferred from said first means to said output line for transferring said feedback signal to said output line.

6. A switching circuit according to claim 5, wherein said third means transfers said one of said plurality of input information and said feedback signal in accordance with a second clock signal different from said first clock signal.

7. A switching circuit comprising:
first means for receiving a plurality of input information;
second means for receiving select signals identifying one of said plurality of input information and for generating selection output signals related to said select signals;
third means for receiving one of said plurality of input information and for producing an output signal related to said one input information;
fourth means connected to said second means and coupled between said first means and said third means for receiving as inputs said plurality of input information from said first means and for transferring one of said plurality of input information from said first means to said third means in response to said selection output signals of said second means; and
fifth means for holding a data signal related to said output signal at said third means and for feeding back said accordance with a first clock signal;
said fourth means further including means, responsive to said selection output signals indicating that said fourth means is to transfer none of said plurality of input information from said first means to said third means, for transferring said feedbackd ata signal at said other input of said fourth means to said third means, said selection signals further identifying that said feedback data signal is to be transferred through said fourth means from said other input to said third means when none of said plurality of input information is to be transferred through said fourth means from said first means to said third means.

8. A switching circuit according to claim 7, wherein said fourth means transfers said one of said plurality of input information and said feedback data signal in accordance with a second clock signal different from said first clock signal.

9. A switching circuit comprising:
a selection circuit including N switching devices, where N is an integer greater than one;
N-1 input lines and a single feedback line connected to respective switching devices for applying respective information signals to respective switching devices;
output means, connected to all of said switching devices to receive an information signal from any of said switching devices, for applying an information signal as an output signal to an output line;
feedback means connected between said output means and said single feedback line for applying said output signal to said feedback line as an information signal; and
selection control means connected to said selection circuit and responsive to a plurality of select signals for operating one of said switching devices to transmit a selected information signal from one of said N-1 input lines or said feedback line to said output means.

10. A switching circuit according to claim 9, wherein said selection control means includes decoding means for operating one of the switching devices connected to said N-1 input lines in response to select signals which identify one of said N-1 input lines, and logic means connected to said decoding means for operating the switching device connected to said feedback line when the select signals receives by said decoding means do not identify one of said N-1 input lines.

11. A switching circuit according to claim 9, wherein said selection control means includes decoding means for decoding said select signals and for producing a control signal to operate one of said switching devices.

12. A switching circuit according to claim 9, wherein said feedback control means includes a further switching device coupling said output means to said feedback line, said further switching device being operated by a first clock signal and said selection circuit being operated by said selection control means in accordance with a second clock signal different from said first clock signal.

* * * * *